United States Patent
Mattisson

(10) Patent No.: US 7,301,404 B2
(45) Date of Patent: Nov. 27, 2007

(54) METHOD AND APPARATUS FOR TRANSCEIVER FREQUENCY SYNTHESIS

(75) Inventor: Sven Mattisson, Bjärred (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 37 days.

(21) Appl. No.: 11/186,060

(22) Filed: Jul. 21, 2005

(65) Prior Publication Data
US 2007/0018732 A1 Jan. 25, 2007

(51) Int. Cl.
H03L 7/07 (2006.01)
H03L 7/16 (2006.01)
H04B 7/00 (2006.01)

(52) U.S. Cl. .............. 331/2; 331/16; 331/18; 455/260

(58) Field of Classification Search ........... 331/2, 331/16, 18, 25; 327/147–150, 156–159; 332/127; 360/51; 375/376; 455/260
See application file for complete search history.

(56) References Cited

U.S. PATENT DOCUMENTS

| | | | |
|---|---|---|---|
| 5,535,432 A * | 7/1996 | Dent | 455/77 |
| 5,856,766 A * | 1/1999 | Gillig et al. | 331/176 |
| 6,321,074 B1 | 11/2001 | Lemay | |
| 6,509,769 B2 * | 1/2003 | Dauth | 327/156 |
| 7,098,754 B2 * | 8/2006 | Humphreys et al. | 332/103 |
| 2002/0077066 A1 | 6/2002 | Pehlke et al. | |
| 2002/0186713 A1 | 12/2002 | Brunel et al. | |
| 2003/0042984 A1 | 3/2003 | Moloudi et al. | |
| 2003/0067359 A1 | 4/2003 | Darabi et al. | |
| 2005/0036566 A1 | 2/2005 | Eikenbroek et al. | |
| 2005/0062547 A1 * | 3/2005 | Reuven | 331/10 |
| 2005/0085206 A1 | 4/2005 | Lee et al. | |

FOREIGN PATENT DOCUMENTS

| | | |
|---|---|---|
| EP | 1206039 | 5/2002 |
| WO | WO98/31094 | 7/1998 |

OTHER PUBLICATIONS

Behzad et al., "A Direct-Conversion CMOS Transciever with Automativ Frequency Control for IEEE 802.11a Wireless LAN", Berkely Wireless Research Center, May 9, 2003.

(Continued)

*Primary Examiner*—David Mis
(74) *Attorney, Agent, or Firm*—Coats & Bennett, P.L.L.C.

(57) ABSTRACT

A method and apparatus for frequency synthesis in a transceiver are based on providing a primary frequency synthesizer configured to synthesize a receiver frequency signal from a receiver reference frequency signal, and providing an offset frequency synthesizer configured to synthesize a transmitter frequency signal from the receiver frequency signal using fractional-N division, which allows it to operate at an intermediate frequency that is a non-integer multiple of the receiver frequency signal. That arrangement enables non-integer duplex frequency distances between desired receive and transmit frequencies. The primary frequency synthesizer also may be operated as a fractional-N frequency synthesizer, meaning that the receiver frequency signal may have a non-integer relationship to the receiver reference frequency signal. Configuring the primary and offset frequency synthesizers to operate with fractional-N frequency synthesis allows independent frequency tuning/optimization of the primary and secondary frequency synthesizers.

22 Claims, 9 Drawing Sheets

OTHER PUBLICATIONS

Magoon et al., "A Single-Chip Quad-Band (850/900/1800/1900 MHz) Direct Conversion GSM/GPRS RF Transceiver with Integrated VCOs and Fractional-N Synthesizer", *IEEE Journal of Solid-State Circuits*, vol. 37, No. 12, Dec. 2002.

Pamarti et al., A Wideband 2.4-GHz Delta-Sigma Fractional-N PLL With 1-Mb/s In-Loop Modulation, *IEEE Journal of Solid-State Circuits*, vol. 39, No. 1, Jan. 2004.

"Reduced Filter Requirements Using an Ultra Low Noise Modulator", Microwave Journal, Horizon House Publications, Inc., vol. 44, No. 1, Jan. 2001.

Riley, T. A. D. et al. "A Simplified Continuous Modular Technique." IEEE Transactions on Circuits and Systems II: Analog and Digital Signal Processing, May 1994, No. 5, New York, USA. XP000460168.

\* cited by examiner

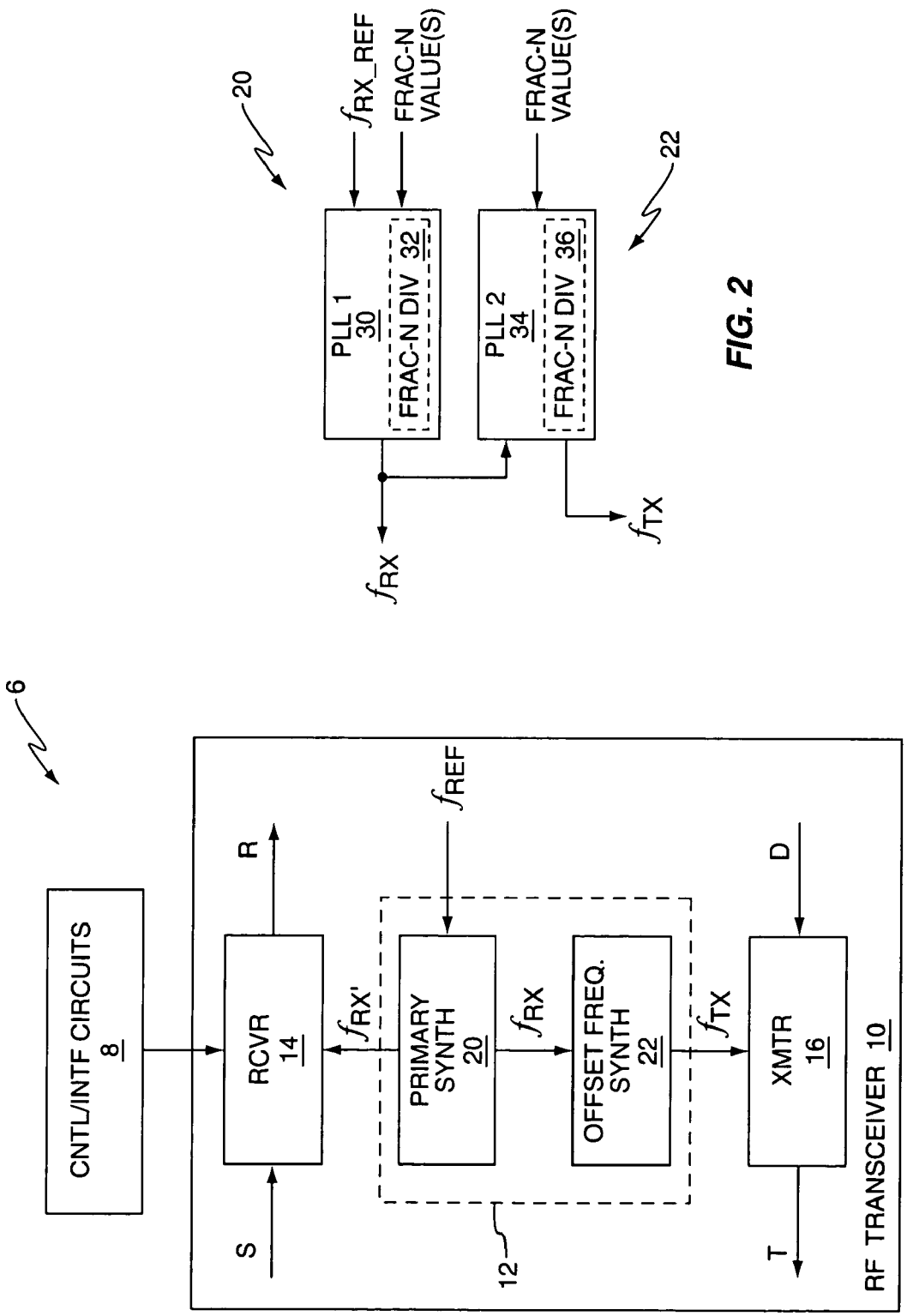

METHOD AND APPARATUS FOR TRANSCEIVER FREQUENCY SYNTHESIS

BACKGROUND

The present invention generally relates to frequency synthesis, and particularly relates to transceiver frequency synthesis, such as in full duplex applications with variable duplex distances.

Frequency synthesizers pose a number of design challenges. For example, in receiver frequency generation, use of fractional-N frequency synthesis can be advantageous because of the flexible choice in frequencies, frequency channel spacing, frequency hopping time, etc., afforded by such configurations. However, fractional-N frequency synthesis can increase spurious frequency noise.

Narrowing the loop bandwidth of the frequency synthesizer mitigates spurious frequency problems. Unfortunately, the narrow loop bandwidth does not complement transmit frequency signal generation, because the narrow bandwidth leaves the frequency synthesizer prone to frequency pulling problems arising from unwanted electromagnetic coupling between the synthesizer's oscillator and the relatively high-power modulated transmit signal present during active transmission. Indeed, the frequency synthesizer's resistance to frequency pulling is directly dependent on its loop bandwidth.

One approach to addressing these competing interests in full duplex applications, which require the simultaneous generation of transmit and receive frequencies, is to implement wholly separate transmitter and receiver frequency synthesizers. While such an approach does provide good flexibility in frequency generation, it still has the problem of finding loop bandwidth compromises between fractional-N divider noise suppression and frequency-pulling sensitivities, and can be expensive and large in terms of circuit board real estate. Other approaches include the use of one or more local oscillators (LOs) common to receive and transmit loops, but such architectures sometimes limit frequency flexibility and/or require significant filtering for noise reduction, etc.

SUMMARY OF THE DISCLOSURE

In one embodiment a frequency synthesizer circuit for a transmitter comprises a primary frequency synthesizer configured to synthesize a receiver frequency signal from a receiver reference frequency signal, and an offset frequency synthesizer configured to synthesize a transmitter frequency signal from the receiver frequency signal using fractional-N division. The primary frequency synthesizer may comprise a first PLL including a first fractional-N divider to derive the receiver frequency signal from the receiver reference frequency signal using first fractional-N division, and the offset frequency synthesizer may comprise a second PLL including a second fractional-N divider to derive the transmitter frequency signal from the receiver frequency signal using second fractional-N division.

Operating the second PLL at an offset frequency determined at least in part by the second fractional-N division enables non-integer duplex distances between desired receive and transmit frequencies. More significantly, the second PLL operates at a transmitter intermediate frequency generated using fractional-N division of the receiver frequency signal output from the first PLL. Because the transmitter intermediate frequency generally has to be the same as the desired duplex distance, or has to be a direct multiple of the desired duplex distance, the use of fractional-N division allows an effectively arbitrary relationship between the receiver frequency signal and the transmitter frequency signal. As such, the design challenges associated with optimizing the first PLL for good receiver performance and the second PLL for good transmitter performance is essentially decoupled.

For example, the loop bandwidth of the first PLL may be made relatively narrow to improve the noise rejection of the first PLL regarding spurious frequency components that often arise in fractional-N frequency synthesis. Narrowing the loop bandwidth of the first PLL generally is not problematic in terms of frequency pulling susceptibility, because the oscillator of the first PLL can be configured to run at a non-harmonic of the transmit frequency. This configuration is not problematic regarding generation of the desired transmitter frequency signal, because the second PLL derives the transmitter frequency signal from the receiver frequency signal using fractional-N frequency synthesis.

Further, the first PLL may be configured to run at a multiple of the desired receive frequency, i.e., the receiver frequency signal generated by the first PLL can be a multiple of the actual desired receiver frequency. Because the second PLL derives its intermediate operating frequency from the receiver frequency signal, it thus may be configured to run at a multiple of the desired transmit frequency. Running the first and second PLLs at multiples of the desired receive and transmit frequencies may allow the use of smaller components, and may provide more flexibility in terms of frequency planning. Note that the first and second PLLs may include output dividers to divide down the receiver frequency signal and transmitter frequency signal to desired receive and transmit frequencies, respectively.

Further, in one or more embodiments of frequency synthesis as taught herein, the offset frequency synthesizer includes or is associated with phase modulation circuitry. For example, a phase modulation circuit may be configured to impart desired phase modulations to the transmitter frequency signal by varying one or more divisor values of the second PLL's fractional-N divider. Similarly, the output from the second PLL's fractional-N divider may serve as an input to a quadrature modulator disposed in the control loop of the second PLL. Additional variations of phase modulation are disclosed in the detailed discussion later herein, and one or more of these phase modulation methods may be combined with various methods of amplitude modulation, for use in half- and full-duplex radio transceiver circuits.

Of course the present invention is not limited to the above features and advantages. Indeed, those skilled in the art will recognize additional features and advantages upon reading the following detailed discussion, and upon viewing the accompanying drawings.

BRIEF DESCRIPTION OF THE DRAWINGS

FIG. 1 is a block diagram of a wireless communication device, including a frequency synthesizer circuit.

FIG. 2 is a block diagram of one embodiment of the frequency synthesizer circuit of FIG. 1, wherein the first and second frequency synthesizers comprise first and second Phase-Locked-Loops (PLLs) including fractional-N dividers.

DESCRIPTION OF EMBODIMENTS OF THE INVENTION

Figure 3:
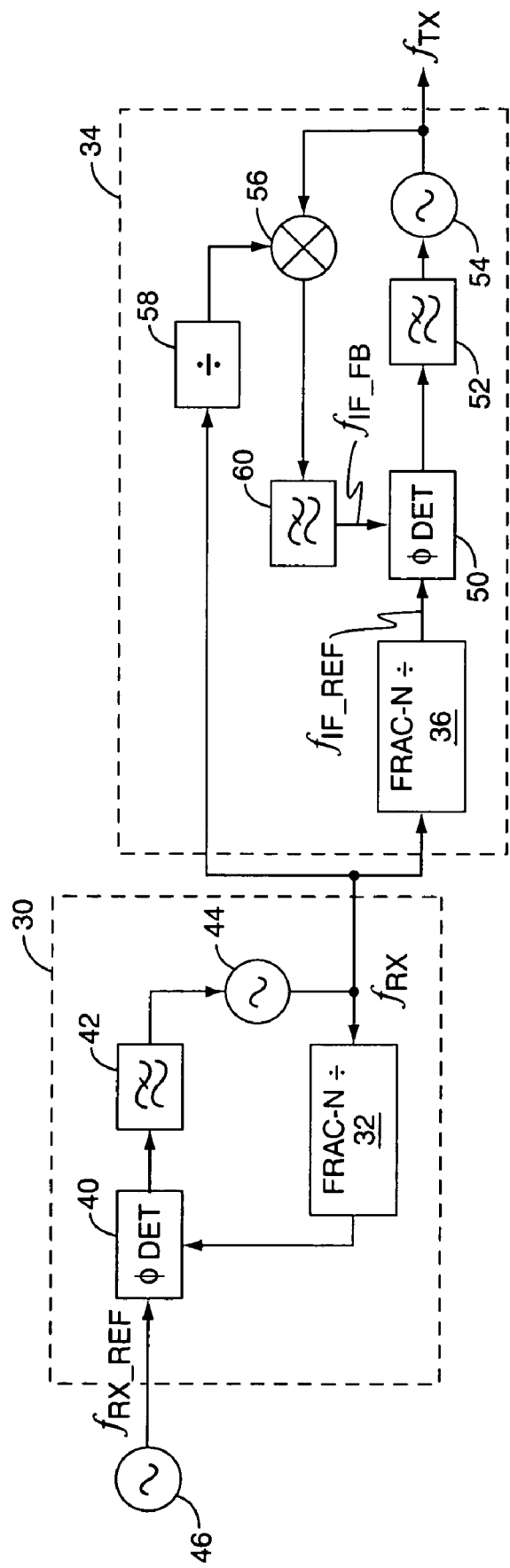
FIG. 3 is a block diagram of PLL circuit details according to one embodiment of the circuits illustrated in FIG. 2.

FIG. 1 illustrates a wireless communication device 6, such as a cellular radiotelephone or other mobile communication device, comprising control and interface circuits 8 and a radiofrequency (RF) transceiver 10. The RF transceiver 10 may be configured for full-duplex and/or half-duplex operation, and comprises a frequency synthesizer 12, a receiver circuit 14 to obtain received signal information (R) from a received signal (S), and a transmitter circuit 16 to generate a transmit signal (T) from transmit data (D).

The RF transceiver 10 is configured to derive a receiver frequency signal ($f_{RX}$) from a reference frequency signal using a primary frequency synthesizer 20, and to derive a transmitter frequency signal ($f_{TX}$) from the receiver frequency signal using an offset frequency synthesizer 22, wherein the offset frequency synthesizer 22 is configured to synthesize the transmitter frequency signal from the receiver frequency signal using fractional-N division. Using fractional-N division in the offset loop enables non-integer duplex distances between receive and transmit frequencies, enables the primary frequency synthesizer 20 to be tuned for optimum receiver performance, and allows the offset frequency synthesizer 22 to be tuned independently for optimum transmitter performance.

As shown in FIG. 2, the primary frequency synthesizer 20 may comprise a first PLL 30 including a first fractional-N divider 32, and the offset frequency synthesizer 22 may comprise a second PLL 34 including a second fractional-N divider 36. As such, the receiver frequency signal ($f_{RX}$) is derived from a receiver reference frequency signal ($f_{RX\_REF}$) according to the fractional-N divisor values used by the first fractional-N divider 32. Similarly, the transmitter frequency signal output from the second PLL 34 depends on the frequency of the receiver frequency signal and on the values used by the second fractional-N divider 36. As such, a flexible, non-integer relationship exists between the receiver reference frequency and the receiver frequency signal, and a similar flexible, non-integer relationship exists between the receiver frequency signal and the transmitter frequency signal.

FIG. 3 better illustrates such flexibility wherein an embodiment of the first PLL 30 comprises a phase detector 40 a loop filter 42 a VCO 44 and the previously discussed fractional-N divider 32. The second PLL 34 comprises a phase detector 50, a loop filter 52, a VCO 54, and frequency mixer 56, an optional (receiver frequency signal) input divider 58, and a filter 60. One sees from the illustration an advantageous arrangement wherein desired transmitter and receiver frequencies are generated using single-VCO PLLs 30 and 34, and wherein the VCO 44 can be operated at a non-harmonic of the transmitter frequency signal, while still allowing the generation of desired receiver and transmitter frequencies according to the required duplex distance, etc.

In operation, a reference frequency generator 46 generates a receiver reference frequency signal that serves as a reference input for the phase detector 40. In turn, phase detector 40 generates an error signal based on phase comparing the reference frequency signal to a feedback frequency signal derived by dividing the receiver frequency signal output by the VCO 44 via the fractional-N divider 32. The loop filter 42 produces a control signal to control the VCO 44 based on filtering the error signal output by the phase detector 40. In this manner, the first PLL 30 provides closed loop frequency control wherein the receiver frequency signal output by the VCO 44 is slaved to the reference frequency provided by the reference frequency generator 46, according to a desired (non-integer) frequency relationship established by the divisor value(s) loaded into the fractional-N divider 32.

In similar fashion, the second fractional-N divider 36 of the second PLL 34 generates an intermediate frequency reference signal ($f_{IF\_REF}$) by dividing the receiver frequency signal ($f_{RX}$) according to a desired (non-integer) frequency relationship. The mixer 56 generates an intermediate frequency feedback signal ($f_{IF\_FB}$) by mixing the transmitter frequency signal ($f_{TX}$) with the receiver frequency signal ($f_{RX}$), or with a divided-down version of the receiver frequency signal, such as may be provided by the optional input divider 58. Note that, if the first PLL 30 is configured to run at a multiple of the desired receive frequency, then the second PLL 34 can operate at a multiple of the desired transmit frequency, or can operate at the desired transmit frequency based on dividing down the receiver frequency signal. Also, if the clock frequency of the first PLL 30 is much higher than the reference frequency ($f_{RX\_REF}$), this effectively pushes the truncation noise from the second fractional-N divider 36 out in frequency, thereby allowing a wider PLL loop gain bandwidth. The wider loop bandwidth yields better VCO frequency pulling resistance and, thus, helps to decouple the problem of limiting noise in the first PLL 30 from the problem of reducing pulling resistance in the second PLL 34.

In any case, the phase detector 50 generates an error signal by phase-comparing the intermediate frequency feedback signal to the intermediate frequency reference signal. In turn, the filter circuit 52 generates a control signal by filtering the error signal, and the VCO 54 generates the transmitter frequency signal responsive to the control signal.

Figure 4:
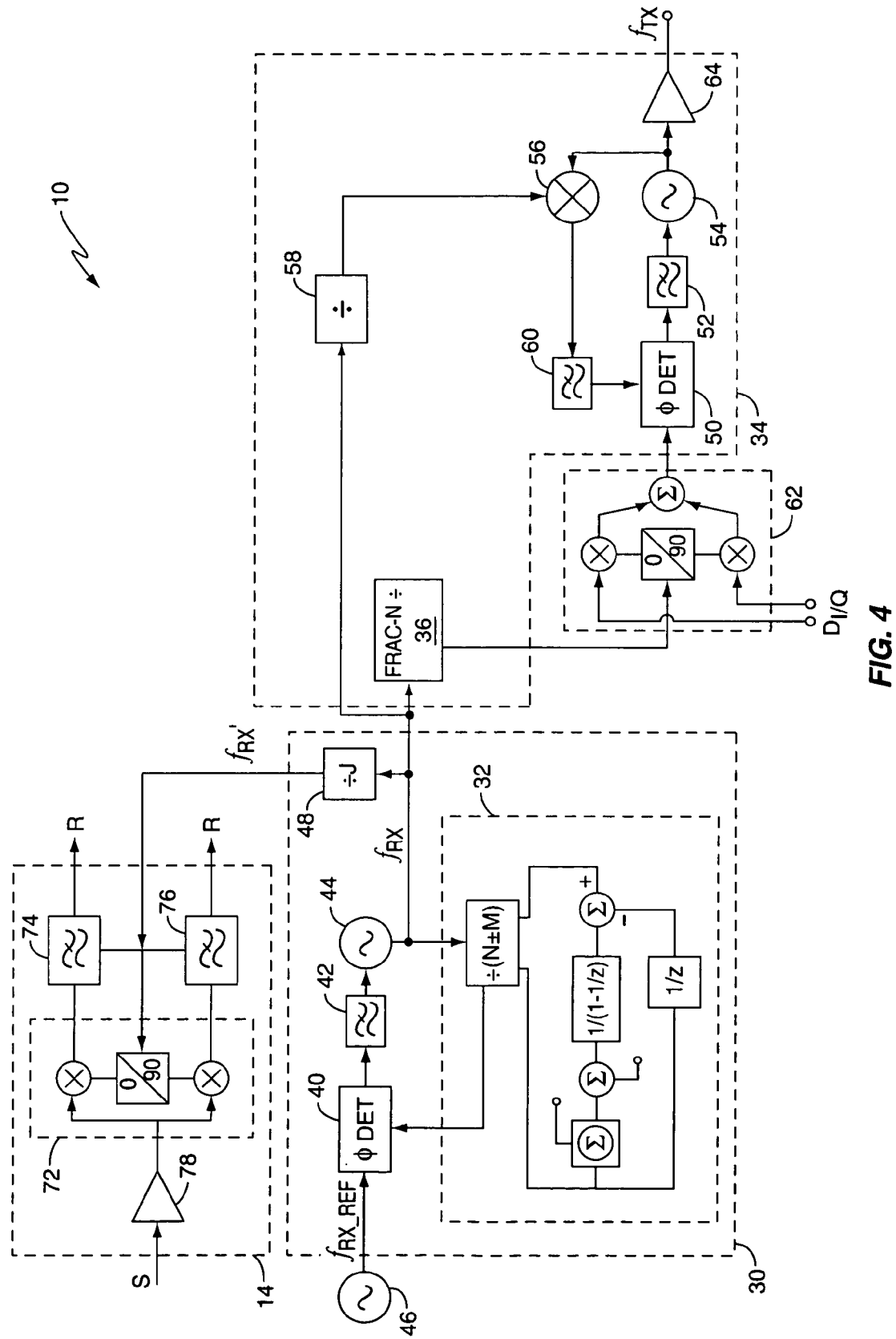
FIGS. 4-10 are block diagram of PLL circuit details according to several embodiments of the circuits illustrated in FIG. 2 and, in particular, illustrate different embodiments of transmitter frequency signal phase and linear modulation.

The above frequency synthesizer architecture represents a basic but non-limiting example of a flexible approach to frequency synthesis that is adaptable to a wide variety of transceiver configurations. For example, FIG. 4 illustrates the use of an I/Q modulator in the intermediate frequency path of the offset PLL 34. Specifically, one sees that the output from the second fractional-N divider 36 is passed into a quadrature modulator 62, which provides its modulated output as an input to the phase detector 50.

Figure 5:
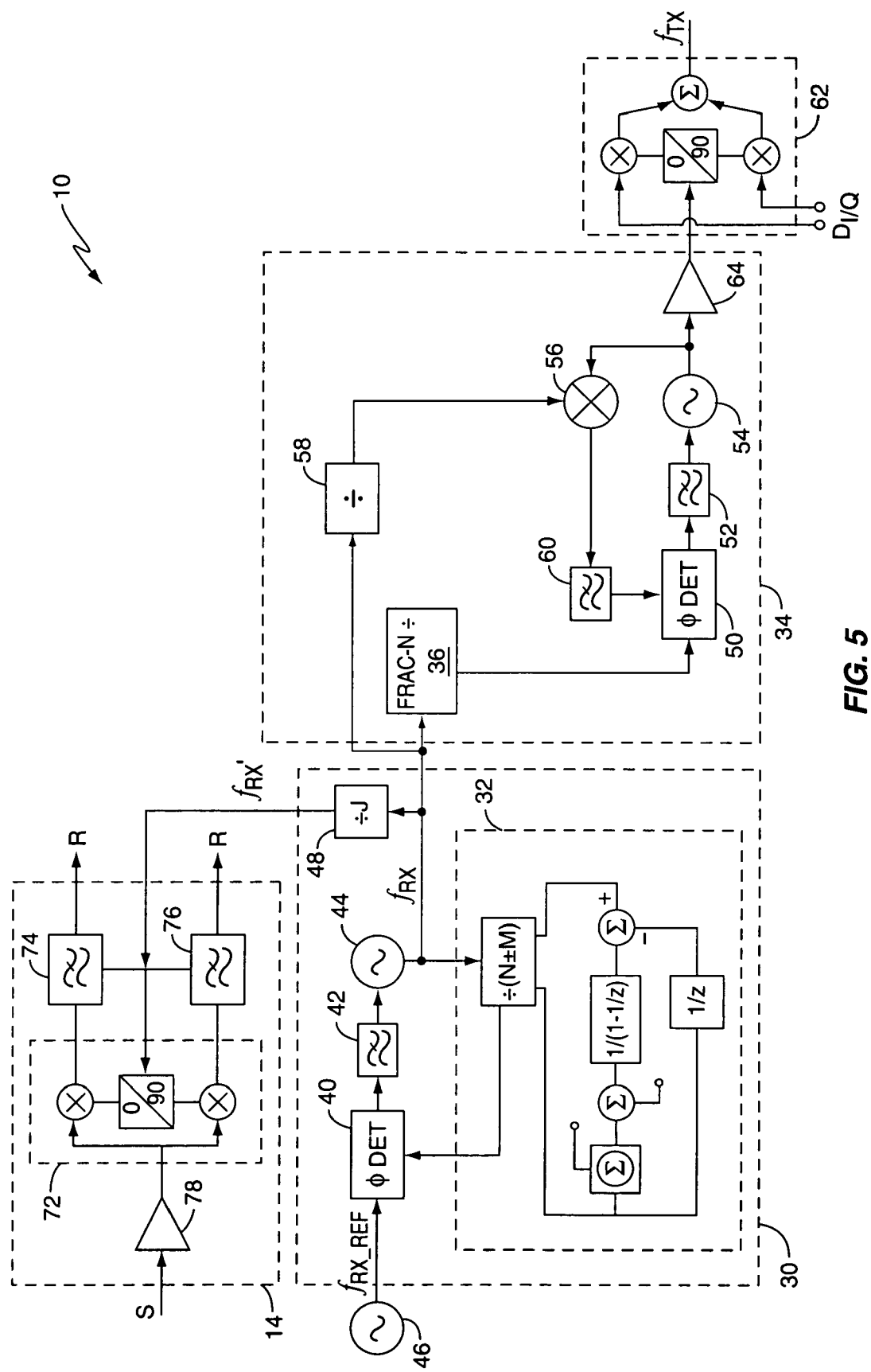

With this circuit arrangement, the transmitter frequency signal output from the second PLL 34 includes desired phase modulations, for input to additional transmitter circuitry associated with necessary power amplification and desired amplitude modulations. Note that the phase modulated transmitter frequency signal may be buffered by the use of an output amplifier 64. FIG. 5 illustrates a similar arrangement, but places the quadrature modulator 62 on the output of the (buffer) amplifier 64.

Figure 6:
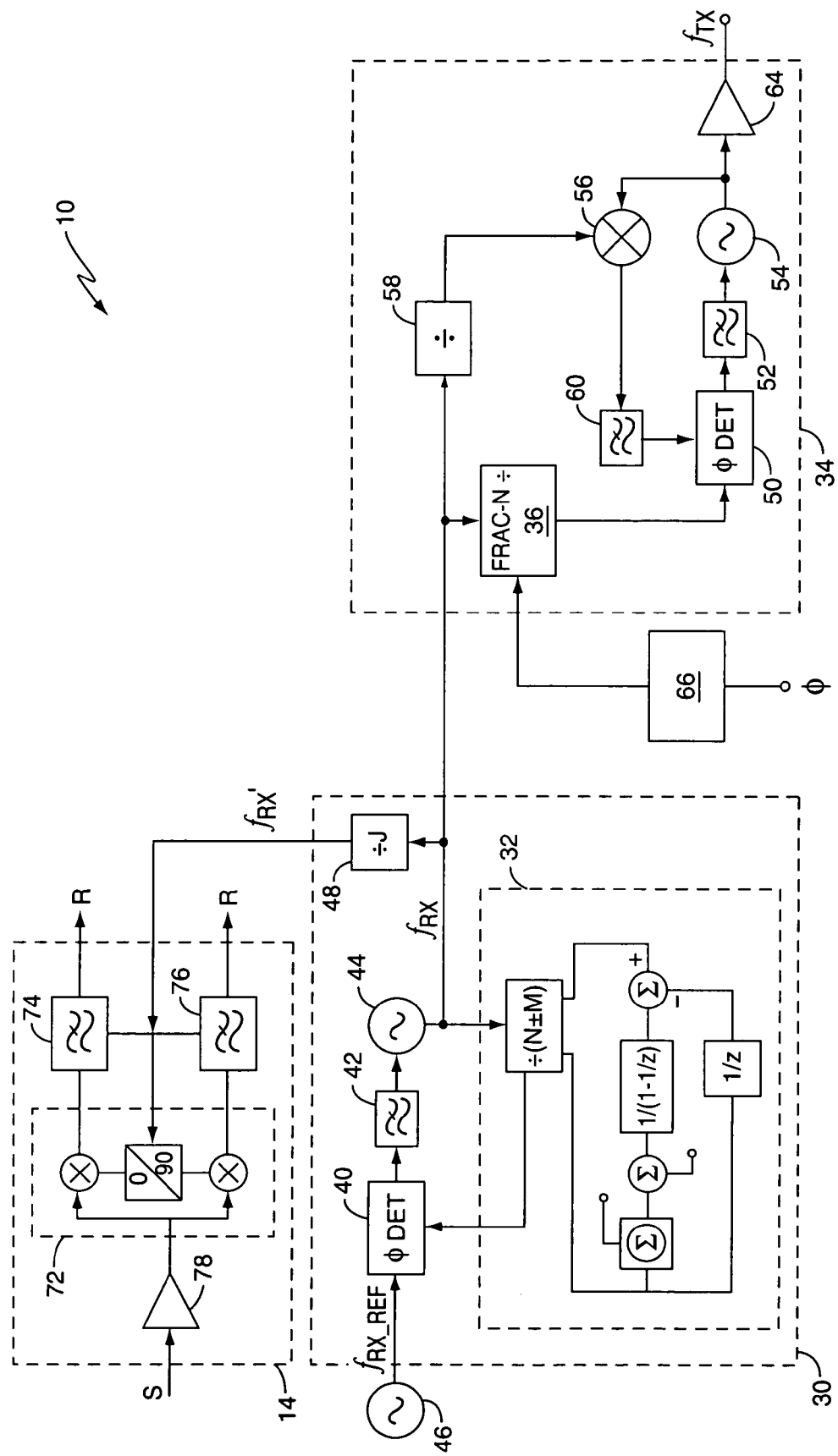

FIG. 6 illustrates a somewhat similar arrangement, but where a phase modulator circuit 66 is included in the second PLL 34, or is associated with it. The phase modulator circuit 66 imparts desired phase modulations to the transmitter frequency signal output by the second PLL 34 based on varying one or more fractional-N divisor values used by the second fractional divider 36. Again, the transmitter frequency signal may be buffered using the amplifier 64, and may serve as an input to additional transmitter circuitry providing desired power amplification and desired amplitude modulation. As such, the arrangements illustrated in FIGS. 4-6 are ideal for so-called polar modulation transmission methods, wherein the desired phase and amplitude modulations are imparted along separate transmit circuit signal paths.

Figure 7:
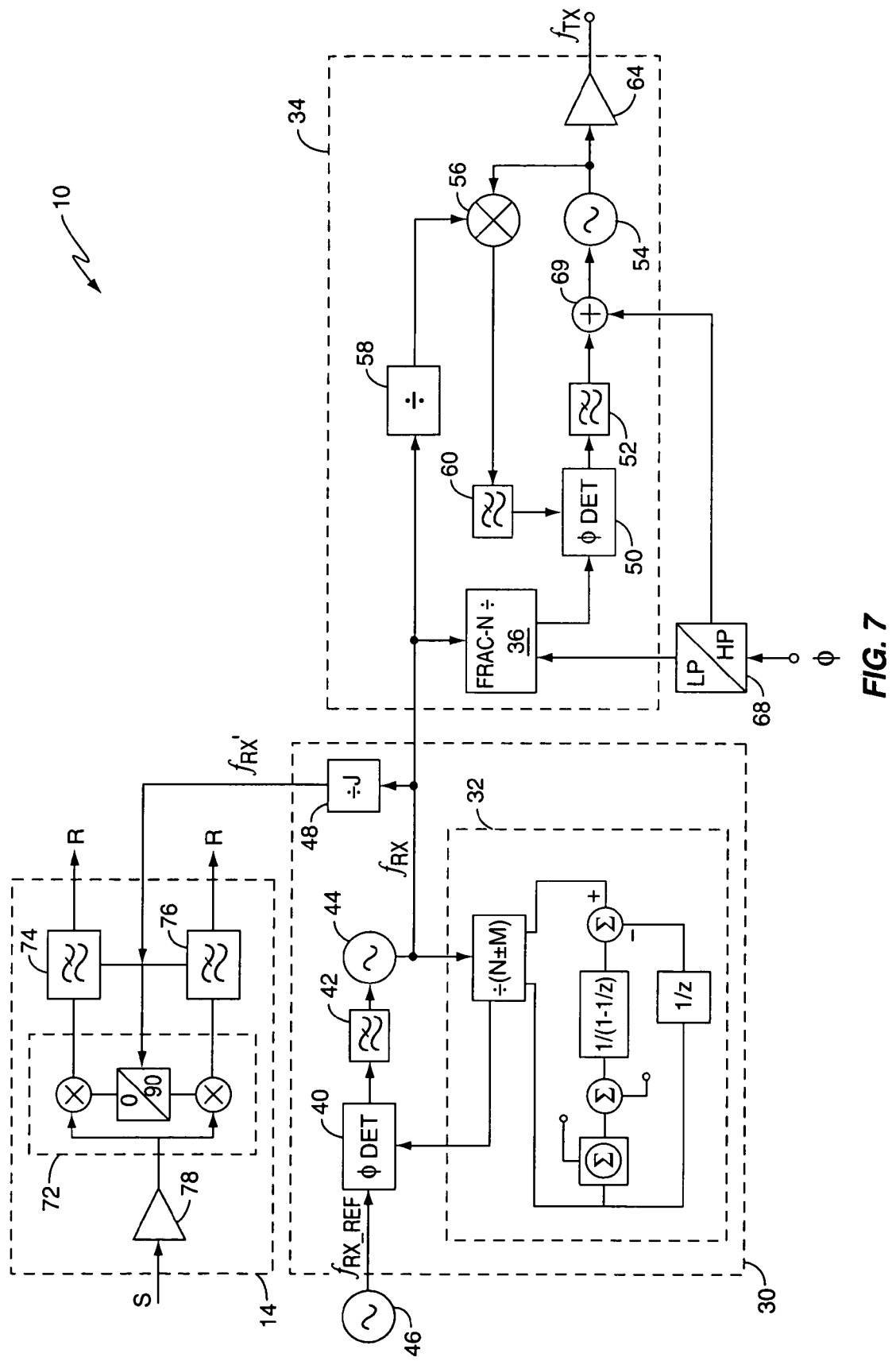

FIG. 7 illustrates an arrangement similar to that shown by FIG. 6, but is distinguished from the architecture of FIG. 6 in that 2-point phase modulation is used. Specifically, a filter/processing circuit 68 provides higher-frequency phase modulations to a summing circuit 69 that is disposed in the control signal path of the voltage controlled oscillator 54 of the second PLL 34, and provides lower-frequency phase modulations in the form of varying divisor values for the fractional-N divider 36 of the second PLL 34.

Figure 8:
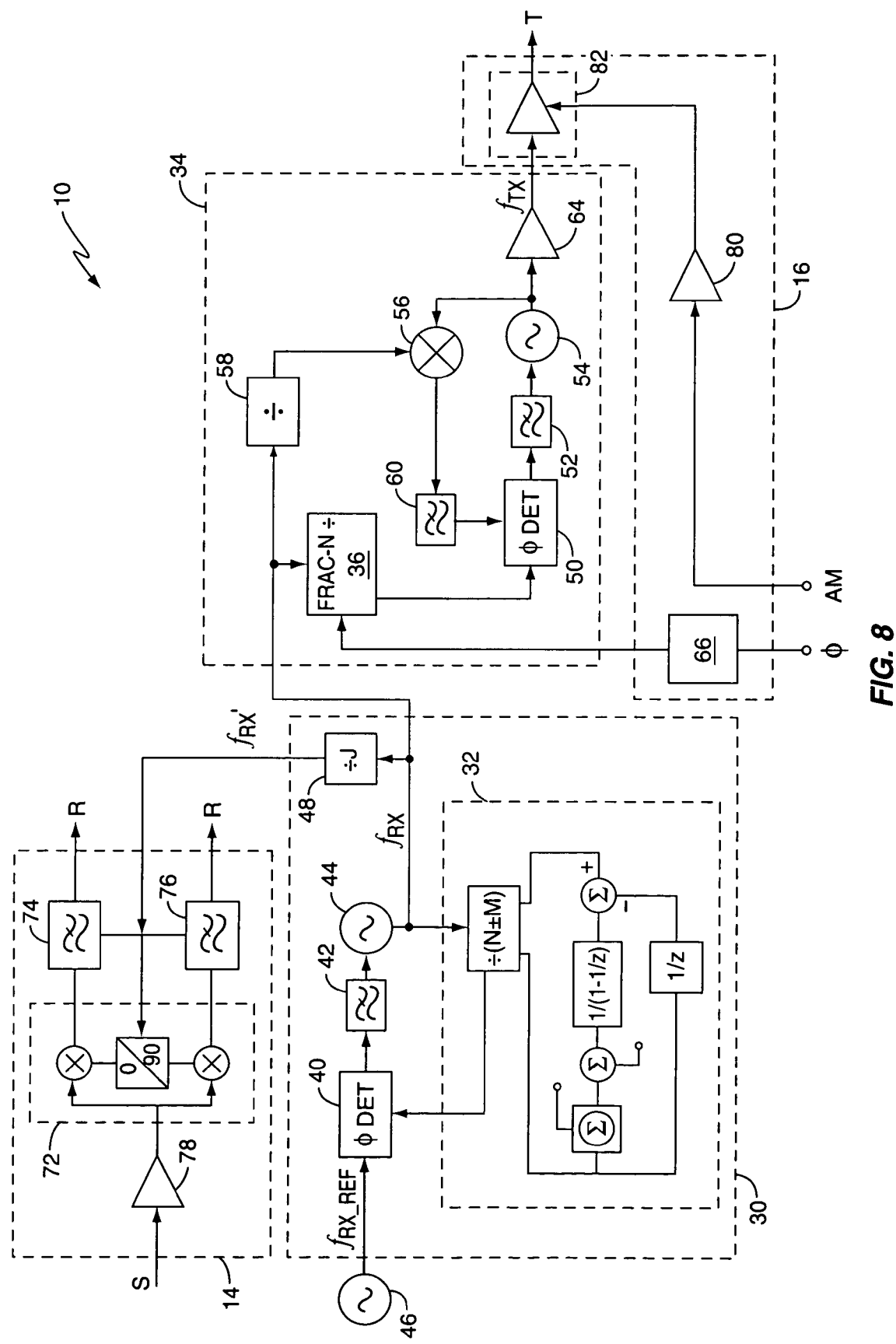

FIG. 8 shows the phase modulation arrangement of FIG. 6, and additionally illustrates one embodiment of the transmitter circuit 16 comprising a supply signal modulation amplifier 80, and a power amplifier 82. An amplitude modulation (AM) signal is applied to an input of the amplifier 80. In turn, the amplifier 80 provides an amplitude modulated supply signal to the power amplifier 82, which may be optimized for class C operation. With this arrangement, amplitude modulations are imparted to the output signal (T) via the amplitude modulations applied to the supply input of the power amplifier 82 (or other amplitude-control input), and the desired phase modulations are applied via the phase-modulated transmitter frequency signal provided by the second PLL 34.

Figure 9:
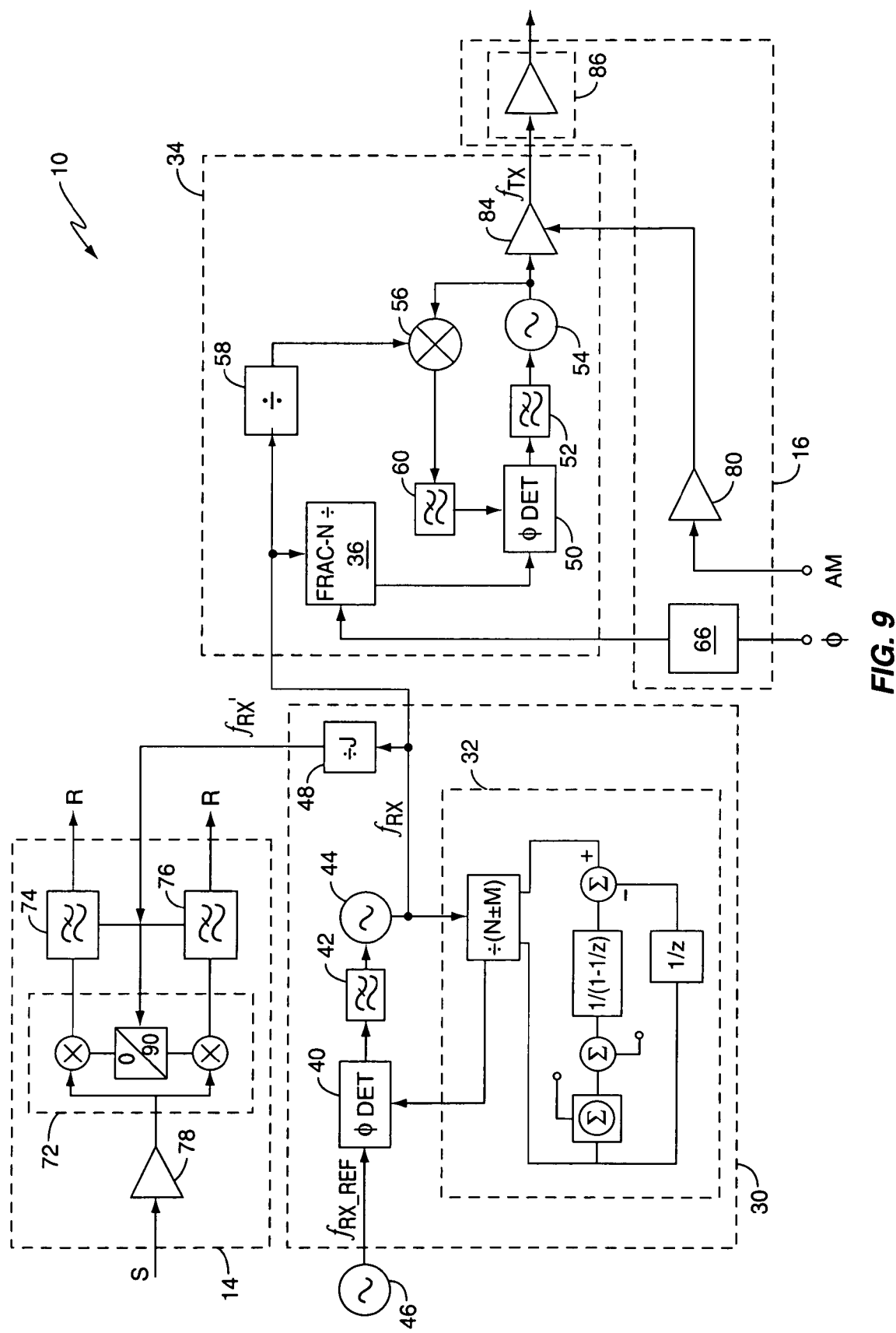

FIG. 9 illustrates a modulation arrangement similar to that depicted in FIG. 8. However, note that amplifier 80 modulates the supply input of a buffer amplifier 84 (or other amplitude-control input), which is used to provide a phase and amplitude modulated transmitter frequency signal to an output amplifier 86. Thus, in this embodiment, the input to the amplifier 86 includes both amplitude and phase modulations, and the power amplifier 86 generally is configured as a linear amplifier. However, note that the power amplifier 86 still may have power-level control, i.e., a slow-changing supply voltage and/or current control applied to its supply input (or to another amplitude-control input).

Figure 10:
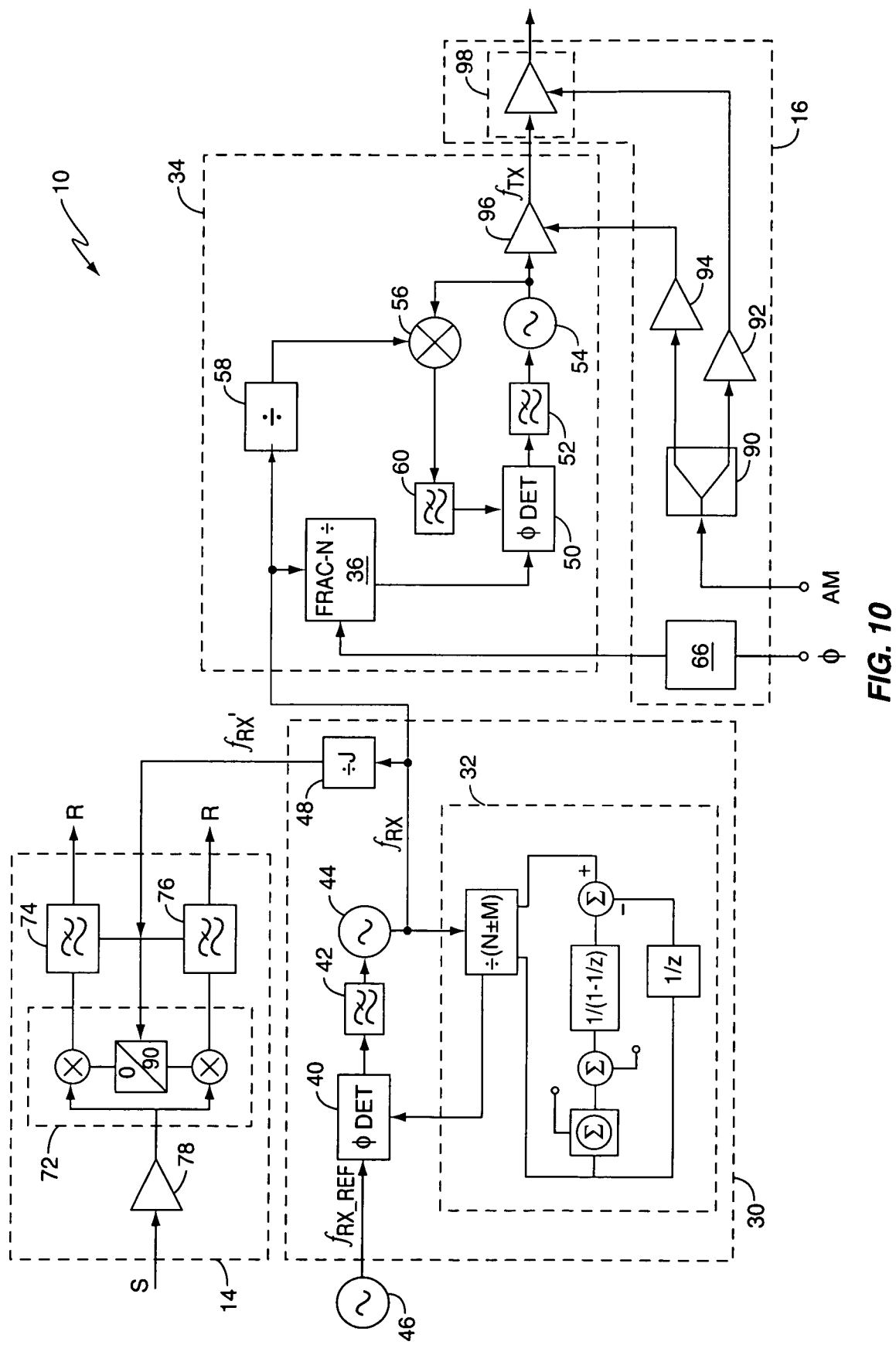

FIG. 10 illustrates a modulation arrangement combining aspects of FIGS. 8 and 9. More particularly, a splitter 90 splits amplitude modulation information between amplifiers 92 and 94. The amplifier 94 provides an amplitude-modulated signal to an amplifier 96, disposed in the phase-modulated, output signal path of the second PLL 34, and the amplifier 92 provides an amplitude modulated signal to a (power) amplifier 98 disposed in the output signal path of the transmitter 16. The amplitude-modulated signals from the amplifiers 92 and 94 may serve as amplitude-modulated supply signals for powering the amplifiers 96 and 98, or such signals may drive other amplitude-control inputs of the amplifiers 96 and 98.

Those skilled in the art will appreciate that additional variations may be implemented regarding amplitude and phase modulation circuit arrangements, and that frequency synthesis as taught herein adapts to a wide range of linear and polar-mode transmit signal generation. More significantly, the apparatus and methods taught herein provide a first PLL 30 that may be configured to have a relatively narrow loop bandwidth relative to receive frequency channel spacing, for example. Narrowing the loop bandwidth improves noise performance of the first PLL 30, and tends to eliminate spurious noise associated with fractional-N frequency synthesis. The first PLL also may be configured to run at a multiple of the desired receive frequency to further improve its loop filter performance (i.e., obtain even better spurious noise rejection and thereby obtain improved Adjacent Channel Power (ACP) performance at the actual receive frequency).

Complementing its narrow loop bandwidth, the first PLL 30 generally is configured to operate at a non-harmonic of the actual transmit frequency, reducing or eliminating its susceptibility to frequency pulling via electromagnetic coupling with the modulated transmit signal. Use of fractional-N frequency synthesis in the second PLL 34 allows the desired transmit frequency (and intermediate) frequency to be conveniently derived from the receiver frequency signal output by the first PLL 30, even though that signal is not at a harmonic of the desired transmit frequency.

Because of this frequency independence, the second PLL 34 may be "tuned" independently of the first PLL 30. That is, the first fractional-N divider 32 can be made variable to support changing receiver frequency assignments, and the second fractional-N divider 36 can be made variable to support changing duplex distances between a desired receive frequency and a desired transmit frequency. This independence allows the loop bandwidth of the first PLL 30 to be optimized for noise rejection, and the loop bandwidth of the second PLL 34 to be independently optimized for resistance to frequency pulling. The arrangement offers the further advantage of using a single VCO in the first PLL 30 to generate the receiver frequency signal, and a single second VCO in the second PLL 34 to generate the transmitter frequency signal.

Of course, those skilled in the art will appreciate that the present invention is not limited to these particular features and advantages. Indeed, the present invention is not limited by the discussion herein relating to various illustrative embodiments, or by the accompanying figures. Rather, the present invention is limited only by the following claims and their legal equivalents.

What is claimed is:

1. A frequency synthesizer circuit for a transceiver comprising:
   a primary frequency synthesizer comprising a first Phase-Locked-Loop (PLL) including a first fractional-N divider configured to synthesize a receiver frequency signal from a receiver reference frequency signal using first fractional-N division;
   an offset frequency synthesizer comprising a second PLL including a second fractional-N divider configured to synthesize a transmitter frequency signal from the receiver frequency signal using second fractional-N division, thereby enabling non-integer duplex distances between receive and transmit frequencies; and
   a phase modulator configured to impart desired phase modulations to the transmitter frequency signal by varying one or more divisor values of the second fractional-N divider.

2. The frequency synthesizer circuit of claim 1, wherein the first PLL includes a single first Voltage Controlled Oscillator (VCO) generating the receiver frequency signal, and wherein the second PLL includes a single second VCO generating the transmitter frequency signal.

3. The frequency synthesizer circuit of claim 1, wherein the first fractional-N divider is variable to support changing receiver frequency assignments, and wherein the second fractional-N divider is variable to support changing duplex distances between a desired receive frequency and a desired transmit frequency.

4. The frequency synthesizer circuit of claim 1, wherein the first PLL is configured to generate the receiver frequency signal as a multiple of a desired receive frequency.

5. The frequency synthesizer circuit of claim 1, wherein the second PLL is configured to generate the transmitter frequency signal as a multiple of a desired transmit frequency.

6. The frequency synthesizer circuit of claim 1, wherein a loop bandwidth of the first PLL is optimized for noise rejection, and wherein a loop bandwidth of the second PLL is independently optimized for resistance to frequency pulling.

7. The frequency synthesizer circuit of claim 1, wherein the second fractional-N divider generates an intermediate frequency reference signal by dividing the receiver frequency signal, and wherein the second PLL includes a Voltage-Controlled-Oscillator (VCO) generating the transmitter frequency signal responsive to a control signal, a filter circuit generating the control signal by filtering an error signal, and a phase detector generating the error signal by phase-comparing an intermediate frequency feedback signal to the intermediate frequency reference signal, a mixer to generate the intermediate frequency feedback signal by mixing the transmitter frequency signal with the receiver frequency signal, or with a divided-down version of the receiver frequency signal.

8. The frequency synthesizer circuit of claim 7, wherein the phase modulation circuit is disposed in an input path of the phase detector in the second PLL, to thereby impart desired phase modulations to the intermediate frequency reference signal, which are thus manifested in the transmitter frequency signal.

9. The frequency synthesizer circuit of claim 8, wherein the phase modulation circuit is configured to impart the desired phase modulations by varying one or more divisor values of the second fractional-N divider.

10. The frequency synthesizer circuit of claim 8, wherein the phase modulation circuit comprises a quadrature modulator.

11. The frequency synthesizer circuit of claim 7, wherein the second PLL includes an input divider circuit configured to generate the divided-down version of the receiver frequency signal for input to the mixer, and wherein a divisor of the input divider circuit and a divisor of the second fraction-n divider determine the offset frequency of the second PLL.

12. The frequency synthesizer circuit of claim 7, wherein the phase modulation circuit comprises a two-point phase modulation circuit configured to impart a first portion of desired phase modulations to the control signal, and a second portion of the desired phase modulations to the second fractional-N divider.

13. The frequency synthesizer circuit of claim 7, wherein the phase modulation circuit is configured to impart the desired phase modulations by varying one or more divisor values of the second fractional-N divider, and includes or is associated with a power amplifier circuit configured to impart amplitude modulations to the transmitter frequency signal.

14. The frequency synthesizer circuit of claim 1, wherein the phase modulation circuit is configured to impart the desired phase modulations to the transmitter frequency signal generated by the offset frequency synthesizer by imparting the desired phase modulations to a divided-down version of the transmitter frequency signal.

15. A radiofrequency transceiver comprising:
a receiver circuit and a transmitter circuit; and
a frequency synthesizer comprising a first PLL configured to derive a receiver frequency signal for the receiver circuit from a reference frequency signal using fractional-N frequency synthesis, and a second PLL configured to derive a transmitter frequency signal for the transmitter circuit from the receiver frequency signal using fractional-N frequency synthesis; and
wherein the frequency synthesizer includes or is associated with a phase modulator configured to impart desired phase modulations to the transmitter frequency signal by varying a fractional-N divisor of the second PLL.

16. The radiofrequency transceiver of claim 15, wherein the first and second PLL circuits are single-VCO (Voltage-Controlled-Oscillator) circuits, and wherein the VCO of the first PLL generates the receiver frequency signal and the VCO of the second PLL generates the transmitter frequency signal.

17. A method of synthesizing receiver and transmitter frequency signals comprising:
deriving the receiver frequency signal from a reference frequency signal using a primary frequency synthesizer; and
deriving the transmitter frequency signal from the receiver frequency signal using an offset frequency synthesizer configured to synthesize the transmitter frequency signal from the receiver frequency signal using fractional-N division, thereby enabling non-integer duplex distances between receive and transmit frequencies;
wherein deriving the receiver frequency signals from a reference frequency signal using a primary frequency synthesizer comprises deriving the receiver frequency signal from a reference frequency signal using a first fractional-N PLL, and wherein deriving the transmitter frequency signal from the receiver frequency signal using an offset frequency synthesizer comprises deriving the transmitter frequency signal from the receiver frequency signal using a second fractional-N PLL; and
further comprising varying a fractional-N divisor of the second PLL to impart desired phase modulations to the transmitter frequency signal.

18. The method of claim 17, further comprising setting a loop bandwidth of the first PLL to optimize noise rejection and independently setting a loop bandwidth of the second PLL to optimize resistance to frequency pulling.

19. The method of claim 18, wherein setting a loop bandwidth of the first PLL to optimize noise rejection comprises configuring the first PLL to have a relatively narrow loop bandwidth, and wherein independently setting a loop bandwidth of the second PLL to optimize resistance to frequency pulling comprises configuring the second PLL to have a relatively wide loop bandwidth.

20. The method of claim 17, further comprising configuring a fractional-N divisor of the first PLL to be variable to support changing receiver frequency assignments, and configuring a fractional-N divisor of the second PLL to be variable to support changing duplex distances between a desired receive frequency and a desired transmit frequency.

21. The method of claim 17, further comprising configuring the first PLL to generate the receiver frequency signal as a multiple of a desired receive frequency, such that the second PLL operates at a multiple of a desired transmit frequency.

22. A wireless communication device including a receiver circuit, a transmitter circuit, and a frequency synthesizer, and wherein the frequency synthesizer comprises a first PLL configured to derive a receiver frequency signal for the receiver circuit from a reference frequency signal using fractional-N frequency synthesis, a second PLL configured to derive a transmitter frequency signal for the transmitter circuit from the receiver frequency signal using fractional-N frequency synthesis, and a phase modulator configured to impart desired phase modulations to the transmitter frequency signal by varying a fractional-N divisor of the second PLL.

* * * * *

UNITED STATES PATENT AND TRADEMARK OFFICE
CERTIFICATE OF CORRECTION

PATENT NO.         : 7,301,404 B2                                  Page 1 of 1
APPLICATION NO.    : 11/186060
DATED              : November 27, 2007
INVENTOR(S)        : Mattisson It is certified that error appears in the above-identified patent and that said Letters Patent is hereby corrected as shown below:

On the Title Page, Item (56), under "OTHER PUBLICATIONS", in Column 2, Line 1, delete "Transciever" and insert -- Transceiver --, therefor.

On the Title Page, Item (56), under "OTHER PUBLICATIONS", in Column 2, Line 2, delete "Automativ" and insert -- Automative --, therefor.

In Column 7, Line 42, in Claim 11, delete "fraction-n" and insert -- fractional-N --, therefor.

Signed and Sealed this

Eighteenth Day of November, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,301,404 B2 | Page 1 of 1 |
| APPLICATION NO. | : 11/186060 | |
| DATED | : November 27, 2007 | |
| INVENTOR(S) | : Mattisson | |

It is certified that error appears in the above-identified patent and that said Letters Patent is hereby corrected as shown below:

On the title page, item (73), under "Assignee", in Column 1, Line 2, after "(publ)" insert -- , Stockholm --.

Signed and Sealed this
Twenty-fourth Day of May, 2011

David J. Kappos
*Director of the United States Patent and Trademark Office*